US011280026B2

(12) United States Patent
Mueller et al.

(10) Patent No.: US 11,280,026 B2
(45) Date of Patent: Mar. 22, 2022

(54) SEMICONDUCTOR WAFER MADE OF SINGLE-CRYSTAL SILICON AND PROCESS FOR THE PRODUCTION THEREOF

(71) Applicant: SILTRONIC AG, Munich (DE)

(72) Inventors: Timo Mueller, Burghausen (DE); Andreas Sattler, Trostberg (DE); Robert Kretschmer, Freiberg (DE); Gudrun Kissinger, Frankfurt (DE); Dawid Kot, Kunice (PL)

(73) Assignee: SILTRONIC AG, Munich (DE)

( * ) Notice: Subject to any disclaimer, the term of this patent is extended or adjusted under 35 U.S.C. 154(b) by 49 days.

(21) Appl. No.: 16/630,194

(22) PCT Filed: Jun. 25, 2018

(86) PCT No.: PCT/EP2018/066945
§ 371 (c)(1),
(2) Date: Jan. 10, 2020

(87) PCT Pub. No.: WO2019/011638
PCT Pub. Date: Jan. 17, 2019

(65) Prior Publication Data
US 2020/0165745 A1 May 28, 2020

(30) Foreign Application Priority Data
Jul. 10, 2017 (EP) .................... 17180551

(51) Int. Cl.
*C30B 29/06* (2006.01)
*C30B 15/04* (2006.01)
(Continued)

(52) U.S. Cl.
CPC ............. *C30B 29/06* (2013.01); *C30B 15/04* (2013.01); *C30B 15/203* (2013.01); *C30B 33/02* (2013.01);
(Continued)

(58) Field of Classification Search
CPC ....... C30B 15/04; C30B 15/203; C30B 25/20; C30B 39/06; C30B 33/02; H01L 21/0254; H01L 21/3225
See application file for complete search history.

(56) References Cited

U.S. PATENT DOCUMENTS

2001/0021574 A1    9/2001  Sueoka et al.
2003/0148634 A1*  8/2003  Holzl .................. H01L 21/3225
                                                                 438/795
(Continued)

FOREIGN PATENT DOCUMENTS

EP        1420440 A1    5/2004
EP        1887110 A1    2/2008
(Continued)

OTHER PUBLICATIONS

European Patent Office, English computer translation of JP 2009269779 A (Year: 2021).*

(Continued)

*Primary Examiner* — Matthew J Song
(74) *Attorney, Agent, or Firm* — Brooks Kushman P.C.

(57) ABSTRACT

A semiconductor wafer made of single-crystal silicon has an oxygen concentration (new ASTM) of not less than $4.9 \times 10^{17}$ atoms/cm$^3$ and not more than $6.5 \times 10^7$ atoms/cm$^3$ and a nitrogen concentration (new ASTM) of not less than $8 \times 10^{12}$ atoms/cm$^3$ and not more than $5 \times 10^{13}$ atoms/cm$^3$, wherein a frontside of the semiconductor wafer is covered with an epitaxial layer made of silicon, wherein the semiconductor wafer comprises BMDs of octahedral shape whose mean size is 13 to 35 nm, and whose mean density is not less than $3 \times 10^8$ cm$^{-3}$ and not more than $4 \times 10^9$ cm$^{-3}$, as determined by IR tomography.

11 Claims, 4 Drawing Sheets

(51) Int. Cl.
*C30B 15/20* (2006.01)
*C30B 33/02* (2006.01)
*H01L 21/02* (2006.01)
*H01L 21/322* (2006.01)

(52) U.S. Cl.
CPC ...... *H01L 21/0254* (2013.01); *H01L 21/3225* (2013.01)

(56) References Cited

U.S. PATENT DOCUMENTS

| | | | |
|---|---|---|---|
| 2010/0047563 A1* | 2/2010 | Nakai | ............... C30B 33/02 428/332 |
| 2011/0084366 A1 | 4/2011 | Nakai et al. | |
| 2012/0306052 A1 | 12/2012 | Ono et al. | |
| 2014/0044945 A1 | 2/2014 | Mueller et al. | |
| 2016/0032491 A1* | 2/2016 | Lu | ............... H01L 21/0262 428/357 |
| 2016/0181313 A1 | 6/2016 | Kadono et al. | |
| 2018/0371639 A1* | 12/2018 | Mueller | ............... C30B 15/04 |

FOREIGN PATENT DOCUMENTS

| | | | |
|---|---|---|---|
| EP | 1914795 A1 | 4/2008 | |
| JP | 2009269779 A * | 11/2009 | ............ C30B 29/06 |
| JP | 2009269779 A | 11/2009 | |
| KR | 10-2017-0038017 A | 4/2017 | |
| TW | 201428854 A | 7/2014 | |
| WO | 2017097675 A1 | 6/2017 | |
| WO | WO-2017097675 A1 * | 6/2017 | ............ H01L 29/34 |

OTHER PUBLICATIONS

Jeita EM-3512, "Method for measuring nitrogen concentration in silicon crystals", Sep. 2009, Published by Japan Electronics and Information Technology Industries Association, and English Translation.

* cited by examiner

SEMICONDUCTOR WAFER MADE OF SINGLE-CRYSTAL SILICON AND PROCESS FOR THE PRODUCTION THEREOF

CROSS REFERENCE TO RELATED APPLICATIONS

This application is the U.S. National Phase of PCT Appln. No. PCT/EP2018/066945 filed Jun. 25, 2018, which claims priority to European Application No. 17180551.8 filed Jul. 10, 2017, the disclosures of which are incorporated in their entirety by reference herein.

BACKGROUND OF THE INVENTION

1. Field of the Invention

The invention relates to a semiconductor wafer made of single-crystal silicon comprising oxygen and nitrogen, wherein a frontside of the semiconductor wafer is covered with an epitaxial layer made of silicon. A semiconductor wafer having a deposited epitaxial layer is also known as an epitaxial semiconductor wafer.

2. Description of the Related Art

When the single crystal from which a semiconductor wafer originates is pulled according to the Czochralski method (CZ method) from a melt contained in a quartz crucible, the crucible material forms a source of oxygen incorporated into the single crystal and the semiconductor wafer derived therefrom. The concentration of oxygen incorporated may be controlled fairly precisely, for example by controlling the pressure and the flow of argon through the pulling apparatus or by tuning crucible and seed crystal rotations during the pulling of the single crystal or by employing a magnetic field which is applied to the melt or by a combination of these measures.

Oxygen plays an important role in the formation of BMD defects (BMDs, Bulk Micro Defects). BMDs are oxygen precipitates grown from BMD seeds in the course of a heat treatment. They act as internal getters, i.e. as energy sinks for impurities and are therefore fundamentally advantageous. One exception is their presence at locations where the intention is to accommodate electronic components. To avoid the formation of BMDs at such locations an epitaxial layer may be deposited on the semiconductor wafer and provision made to accommodate the electronic components in the epitaxial layer.

Hoelzl et al. found that the BMD total inner surface (BMD density×average BMD surface) is important for the getter efficiency and they defined a critical normalized inner surface for efficient gettering, see R. Hölzl, M. Blietz, L. Fabry, R. Schmolke: "Getter efficiencies and their dependence on material parameters and thermal processes: How can this be modeled?", Electrochemical Society Proceedings Volume 2002-2, 608-625.

The presence of nitrogen in the single crystal promotes the formation of BMD seeds. Doping the single crystal with nitrogen is thus generally suitable for achieving higher densities of BMDs. The concentration of nitrogen in the single crystal may be adjusted within wide limits, for example by dissolving a nitrogenous material in the melt or by gassing the melt with a gas comprising nitrogen or a nitrogenous compound.

Also of particular importance during the pulling of a single crystal of silicon by the CZ method is the control of the ratio V/G of pulling velocity V and axial temperature gradient G at the crystallization interface. The pulling velocity V is the velocity at which the growing single crystal is lifted upward away from the melt and the axial temperature gradient G is a measure of the change in temperature at the crystallization interface in the direction of the crystal lifting.

The type and concentration of point defects (vacancies and interstitial silicon atoms) that dominate in the single crystal are substantially determined by the V/G quotient. BMDs can be developed particularly in a region in which the number of vacancies exceeds the number of interstitial silicon atoms and in which vacancies therefore dominate.

When there is a comparatively large supersaturation of vacancies present during crystallization of the single crystal, which is the case for a comparatively high V/G quotient, the vacancies form agglomerates which can be verified for example as COPs (Crystal Originated Particles).

When V/G and thus the supersaturation of the vacancies is somewhat lower than would be necessary for formation of COPs, seeds of OSF defects (Oxidation Induced Stacking Faults) form instead of COPs. In this case the single crystal crystallizes in the OSF region.

When the V/G quotient is still smaller, a region in which vacancies still dominate but which is classed as defect-free because COPs and OSFs are not formed therein is formed during crystallization of the single crystal. Such a region is referred to as a $P_v$ region.

Further reduction of the V/G quotient causes the single crystal to grow in the $P_i$ region which is likewise classed as defect-free but in which interstitial silicon atoms dominate.

The axial temperature gradient G at the crystallization interface and the radial progression thereof are determined by the heat transport to and from the crystallization interface. The heat transport is in turn substantially influenced by the thermal properties of the environment of the growing single crystal, the so-called hot zone, and by the supply of heat through one or more heating apparatuses.

When it has been decided to pull a single crystal in a certain hot zone, the axial and radial progression of the axial temperature gradient G at the crystallization interface may be determined by means of simulation calculations which take into account the heat balance. Appropriate configuration of the hot zone can also ensure that the axial temperature gradient G has a desired progression along the radius of the single crystal. As a result of the growth of the single crystal and the reduction in the volume of the melt, the thermal conditions and thus also the axial progression of the axial temperature gradient G at the crystallization interface change over time. To keep the V/G quotient in an intended region in the axial direction too it is thus necessary to compensate for the change over time in the axial temperature gradient G through a corresponding change in the pulling velocity V. Controlling the pulling velocity V thus also makes it possible to control the V/G quotient.

EP 1 887 110 A1 relates to the production of a semiconductor wafer which is made of single-crystal silicon, comprises oxygen, nitrogen and hydrogen and originates from a single crystal pulled in the $P_v$ region. It is reported that the presence of nitrogen and to a lesser extent that of hydrogen makes it possible to be able to utilize a larger range of pulling velocities in order to be able to crystallize the single crystal in the $P_v$ region. It is further proposed to choose a relatively high concentration of oxygen in the semiconductor wafer and to subject the semiconductor wafer to a heat treatment by RTA (rapid thermal anneal).

US 2011/0084366 A1 concerns the production of a semiconductor wafer which is made of single-crystal silicon, which comprises oxygen, nitrogen and hydrogen and whose frontside is covered with an epitaxial layer. It is apparent from the document that it is advantageous when the semiconductor wafer comprises nitrogen and hydrogen in certain amounts. The presence of hydrogen counters the formation of OSFs in the semiconductor wafer and defects derived therefrom in the epitaxial layer without simultaneously impairing the activity of nitrogen as an additive that promotes the formation of BMD seeds. However, it is indicated that the presence of hydrogen in the semiconductor wafer can be responsible for the formation of dislocations in the epitaxial layer and that the agglomerates of vacancies are starting points for these dislocations.

US2001/021574 A1 relates to a method of manufacturing a silicon epitaxial wafer comprising the steps of: producing a silicon single crystal having a nitrogen concentration of at least $1\times10^{12}$ atoms/cm$^3$ and an oxygen concentration in a range of $10$-$18\times10^{17}$ atoms/cm$^3$; slicing a silicon wafer from the silicon single crystal; growing an epitaxial film on the surface of the silicon wafer; and conducting an annealing at a temperature in a range of 800-1100° C. after growing the epitaxial film, so as to satisfy the following equation $t \geq 3^{3-(T-800)/100}$ wherein T is temperature in ° C. and t is time in hours.

An IG (intrinsic getter) capability evaluation method is shown which is based on size distributions of BMDs calculated by Fokker-Planck simulations. Specifically, for IG capability, whether the equation $L \times D^{0.6} = 10^7$ is satisfied is determined, wherein L (nm) is the diagonal length of BMD, and D (cm$^{-3}$) is the BMD density. If the above equation is satisfied, the inventors believe that an excellent IG capability can be obtained.

US 2012/0306052 A1 refers to a silicon wafer comprising a wafer in which a nitrogen concentration is $1\times10^{12}$ atoms/cm$^3$ or more and an epitaxial layer is provided on the wafer, wherein polyhedron oxygen precipitates (mainly octahedral oxygen precipitates) predominant over plate-like oxygen precipitates in the wafer when a thermal treatment is performed on the wafer at 750° C. for 4 hours and then at 1000° C. for 4 hours.

This silicon wafer is manufactured by a method comprising forming an epitaxial layer on a wafer, in which a nitrogen concentration is $1\times10^{12}$ atoms/cm$^3$ or more, to form the silicon wafer; raising a temperature of the silicon wafer at a rate of 5° C. per minute or more within a temperature range that is greater than or equal to at least 800° C. and heating the silicon wafer at a temperature that is greater than or equal to 1050° C. and less than or equal to a melting point of silicon for 5 minutes or more. By such thermal pretreatment larger amounts of BMD nuclei which grow into polyhedron BMDs are formed.

US 2012/0306052 A1 subjected wafers with an interstitial oxygen concentration of $12.5\times10^{17}$ atoms/cm$^3$ to various kinds of thermal treatments to form BMDs of different shapes and sizes, e.g. to form polyhedron BMDs of sizes from 45 to 115 nm (Table 1). Wafers with a polyhedron shape did not show any dislocation after LSA (Laser Spike Anneal). Polyhedron BMDs become predominant if during thermal treatment to form BMD nucleii a) the heating rate is greater than or equal to 5° C.; b) a holding temperature is at least 1050° C., and c) the holding time is at least 5 min.

WO 2017/097675 A1 discloses a process for producing a semiconductor wafer from single-crystal silicon, comprising pulling a single crystal from a melt by the CZ method at a pulling velocity V, wherein the melt is doped with oxygen, nitrogen and hydrogen and the single crystal grows at a crystallization interface;

controlling the incorporation of oxygen, nitrogen and hydrogen in a section of the single crystal having a uniform diameter in such a way that the oxygen concentration is not less than $4.9\times10^{17}$ atoms/cm$^3$ and not more than $5.85\times10^{17}$ atoms/cm$^3$, the nitrogen concentration is not less than $5\times10^{12}$ atoms/cm$^3$ and not more than $1.0\times10^{14}$ atoms/cm$^3$ and the hydrogen concentration is not less than $3\times10^{13}$ atoms/cm$^3$ and not more than $8\times10^{13}$ atoms/cm$^3$;

controlling the pulling velocity V such that it is within a span $\Delta V$ within which the single crystal in the section having a uniform diameter grows in a $P_v$ region, wherein the pulling velocity V is in a subrange of the span which comprises 39% of the span and a lowest pulling of velocity of the subrange is 26% greater than a pulling velocity $V_{Pv/Pi}$ at the transition from the $P_v$ region to a $P_i$ region; and separating the semiconductor wafer from the section of the single crystal having a uniform diameter.

It also discloses a semiconductor wafer made of single-crystal silicon comprising an oxygen concentration of not less than $4.9\times10^{17}$ atoms/cm3 and not more than $5.85\times10^{17}$ atoms/cm$^3$; a nitrogen concentration of not less than $5\times10^{12}$ atoms/cm$^3$ and not more than $1.0\times10^{14}$ atoms/cm3; a hydrogen concentration of not less than $3\times10^{13}$ atoms/cm$^3$ and not more than $8\times10^{13}$ atoms/cm$^3$; wherein a frontside of the semiconductor wafer is covered with an epitaxial layer made of silicon and wherein the density of BMDs is not less than $3\times10^8$/cm$^3$ and not more than $5\times10^9$/cm$^3$ evaluated by IR tomography after heat treatments of the semiconductor wafer at a temperature of 780° C. over a period of 3 h and at a temperature of 1000° C. over a period of 16 h.

However, the mean size of BMDs after such thermal cycle has to be from 85-95 nm to show sufficient gettering (when following the findings of US2001/021574 A1). Such BMDs might be too large to avoid lattice defects due to strain from BMDs. A further heat treatment at temperatures above 1000° C. might be needed to avoid the occurrence of dislocation during high temperature device processes (see US 2012/0306052 A1).

On the other hand, future customer low thermal budget device cycles are too small to generate sufficient BMD total inner surfaces (TIS) for efficient gettering of nickel which is advantageous to ensure absence of excess built up stress which otherwise might create slip and crack events at device structures at the <=10 nm design rule regime.

Thus, the problem to be solved by the invention was to provide an epitaxial silicon wafer which shows efficient gettering of nickel as well as reduced thermal stress after applied thermal steps during processing by the customer.

SUMMARY OF THE INVENTION

The foregoing problems are solved by a semiconductor wafer made of single-crystal silicon with an oxygen concentration (new ASTM) of not less than $4.9\times10^{17}$ atoms/cm$^3$ and of not more than $6.5\times10^{17}$ atoms/cm$^3$ and a nitrogen concentration (new ASTM) of not less than $8\times10^{12}$ atoms/cm$^3$ and not more than $5\times10^{13}$ atoms/cm$^3$, wherein a frontside of the semiconductor wafer is covered with an epitaxial layer made of silicon, wherein the semiconductor wafer comprises BMDs of octahedral shape whose mean size is 13 to 35 nm and whose mean density is not less than $3\times10^8$ cm$^{-3}$ and not more than $4\times10^9$ cm$^{-3}$, determined by IR tomography.

DETAILED DESCRIPTION OF THE PREFERRED EMBODIMENTS

Figure 1:
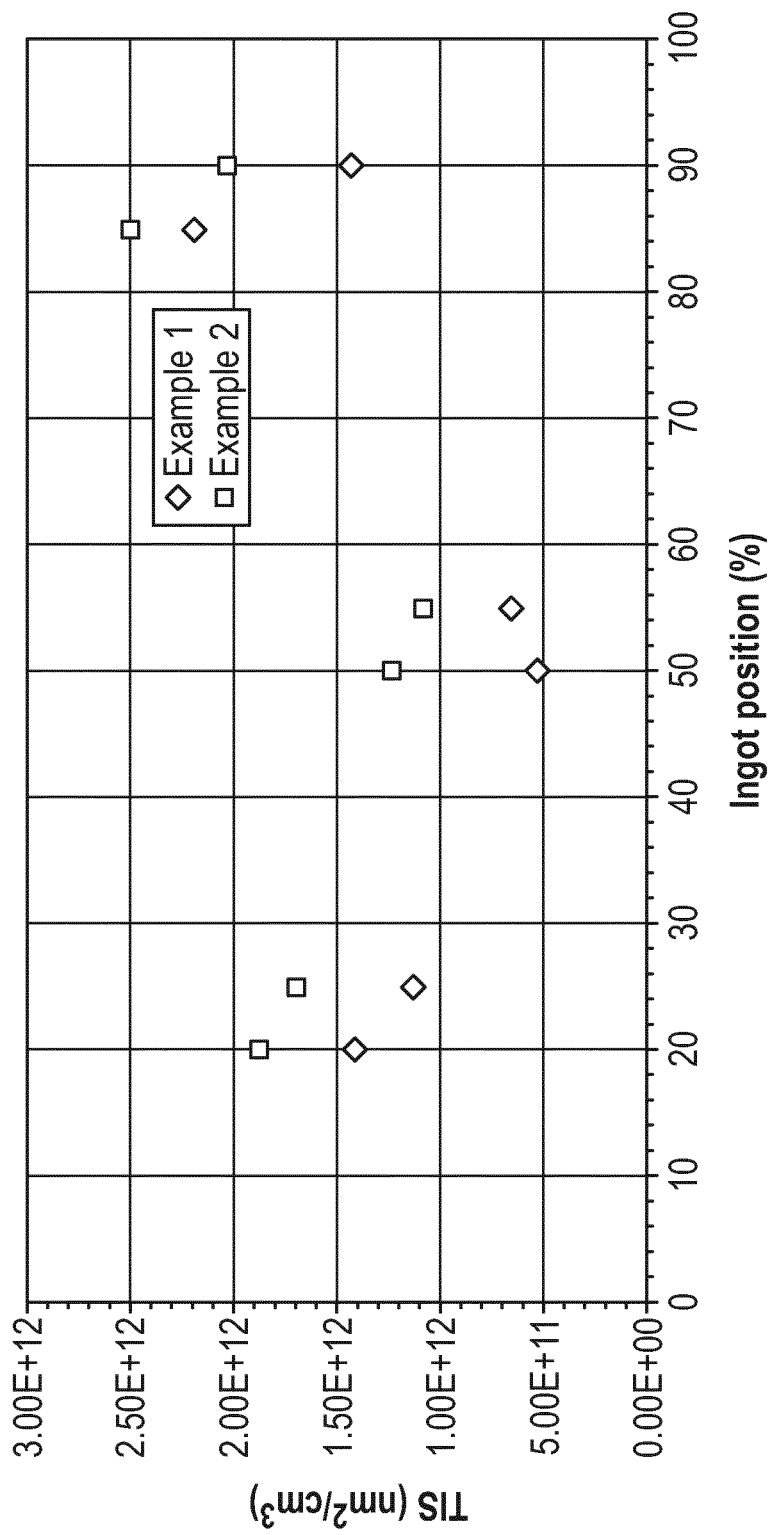
FIG. 1 shows the TIS over the ingot position for Examples 1 and 2.

The inventors found that octahedral shaped BMDs of a semiconductor wafer as described above is stable after thermal treatments at 1000° C. for 5 hours in a depth of at least 100 μm.

In one embodiment, the density of BMDs varies by not more than 50% based on a mean density.

In one embodiment, the size of BMDs varies by not more than 50% based on a mean size.

According to one embodiment, the nickel getter efficiency is at least 80%. More preferred is a nickel getter efficiency of at least 90%. The nickel getter efficiency is defined as by the amount of Ni on both wafer surfaces compared to the total intentional contamination of Ni.

In one embodiment the nickel getter efficiency is at least 95%.

According to one embodiment the TIS (total inner surface) is from $4.0 \times 10^{11}$ nm$^2$/cm$^3$ to $7 \times 10^{12}$ nm$^2$/cm$^3$, preferably from $2.5 \times 10^{12}$ nm$^2$/cm$^3$ to $7 \times 10^{12}$ nm$^2$/cm$^3$.

TIS is defined as BMD density (all)×avg. BMD surface. TIS=$4 * \pi * r^2 *$D(BMD), where r=mean radius of BMD and D(BMD) is the BMD density.

Total inner surfaces are determined by experimental data sets for each of individual measured getter efficiencies.

According to one embodiment, the semiconductor wafer has an oxygen concentration (new ASTM) of not less than $5.25 \times 10^{17}$ atoms/cm$^3$ and not more than $6.25 \times 10^{17}$ atoms/cm$^3$.

According to one embodiment, the semiconductor wafer has a nitrogen concentration (new ASTM) of not less than $0.7 \times 10^{13}$ atoms/cm$^3$ and not more than $1.3 \times 10^{13}$ atoms/cm$^3$.

To be able to achieve adequate activity as internal getters, the density of BMDs must be not less than $3 \times 10^8$/cm$^3$. The oxygen concentration should not exceed the upper limit of $6.5 \times 10^{17}$ atoms/cm$^3$ because otherwise the semiconductor wafer tends to form twin dislocations on the surface of the epitaxial layer.

The infrared absorption of the interstitial oxygen concentration at a wave length of 1107 cm$^{-1}$ is determined by using an FTIR spectrometer. The method is performed according to SEMI MF1188. The method is calibrated with international traceable standards.

The infrared absorption of the nitrogen concentration at wave lengths of 240 cm$^{-1}$, 250 cm$^{-1}$ and 267 cm$^{-1}$ is determined by using an FTIR spectrometer. The tested material is heated to 600° C. for 6 hours prior to the measurement. The sample is cooled to 10 K during the measurement. The method is calibrated by standards with known nitrogen concentrations.

The correlation to SIMS is as follows: Nitrogen conc. FTIR (at/cm$^3$)=0.6*Nitrogen conc. SIMS(atoms/cm$^3$).

BMD size and density are determined from the center to the edge of the semiconductor wafer with an edge exclusion of 2 mm and evaluated by infrared laser scattering tomography.

In the method of inspecting a wafer section by laser scattering (IR-LST=infrared laser scattering tomography) the BMD scatters the incident light which is recorded by a CCD camera close to the cleaved edge of the sample. The measurement of the density of BMDs by IR-LST is effected along a radial broken edge of the heat treated semiconductor wafer. The method of measurement is known per se (Kazuo Moriya et al., J. Appl. Phys. 66, 5267 (1989)).

As an example, the LST-300A and new generations of the Light Scattering to Tomograph Micro- and Grown-in Defect Analyzer manufactured by Semilab Semiconductor Physics Laboratory Co. Ltd. can be used.

The size of a BMD is calculated from its intensity of scattered light, which is measured by a CCD detector. The detectable minimum size is limited by the achievable signal-to-noise ratio—also known as camera sensitivity. The newest IR-LST generation provides a camera with lower spectral noise, offering the possibility to gain sensitivity by a longer integration time at the expense of throughput. The lower size detection limit can be decreased from about 18 nm (standard IR-LST setting) to about 13 nm in high sensitivity mode, meaning a factor of 4 in measurement time.

BMDs with an octahedral shape means BMDs surrounded with plural {111} planes or BMDs surrounded with plural {111} planes and additional {100} planes. BMDs surrounded with planes other than {111} and {100} planes sometimes appear.

In contrast, plate shaped BMDs are surrounded with two comparatively large {100} planes.

The octahedral shape is distinguished from the plate shape as follows:

Of the sizes in the {100} and {010} directions viewed from the {001} direction, the longer one is represented as A and the shorter one is represented as B.

BMDs with an ellipticity (=ratio A/B) of not more than 1.5 have an octahedral shape.

BMDs with an ellipticity exceeding 1.5 are plate-shaped. The diagonal size of an octahedral BMD means the longer direction A of the above {100} and {010} directions.

Mean size of the octahedral BMDs is defined as mean diagonal size.

The invention is also directed to a process for producing a semiconductor wafer made of single-crystal silicon, comprising pulling a single crystal from a melt according to the CZ method in an atmosphere comprising hydrogen, wherein nitrogen has been added to the melt, so that in a section of the single crystal having a uniform diameter the oxygen concentration is not less than $4.9 \times 10^{17}$ atoms/cm$^3$ and not more than $6.5 \times 10^{17}$ atoms/cm$^3$, the nitrogen concentration is not less than $8 \times 10^{12}$ atoms/cm$^3$ and not more than $5 \times 10^{13}$; and the hydrogen concentration is not less than $3 \times 10^{13}$ atoms/cm$^3$ and not more than $8 \times 10^{13}$ atoms/cm$^3$;

controlling a pulling velocity V such that it is within a span ΔV within which the single crystal in the section having a uniform diameter grows in a Pv region, wherein the pulling velocity V is in a subrange of the span which comprises 39% of the span and a lowest pulling velocity of the span is 26% greater than a pulling velocity at the transition from the Pv region to a Pi region;

and separating the semiconductor wafer from the section of the single crystal having a uniform diameter;

depositing an epitaxial layer of silicon on a frontside of the separated semiconductor wafer to form an epitaxial wafer;

heat treating the epitaxial wafer at a temperature of 1015-1035° C. for 1 to 1.75 hours in an ambient comprising Ar, N$_2$, O$_2$ or mixtures thereof.

A heat treatment of the semiconductor wafer or of the single crystal which is performed before the deposition of an epitaxial layer on the semiconductor wafer in order to generate and/or stabilize BMD seeds not dissolved during the deposition of the epitaxial layer is not a constituent of the process.

The process according to the invention comprises heat treating the epitaxial wafer at a temperature of 1015-1035° C. for 1 to 1.75 hours in an ambient comprising Ar, $N_2$, $O_2$ or mixtures thereof. Preferably, the heat treating is done in an $N_2/O_2$ ambient.

According to one embodiment, the heat treating comprises a first step at a temperature of 770-790° C. for 20 to 200 minutes and a second and final step at a temperature of 1015-1035° C. for 1 to 1.75 hours.

According to one embodiment, the heat treating is started at a temperature of 600-700° C., wherein the ramp rates are not higher than 8° C./min and not lower than 2.5° C./min.

According to one embodiment, the incorporation of oxygen in a section of the single crystal having a uniform diameter is controlled such that the oxygen concentration is not less than $5.25 \times 10^{17}$ atoms/cm$^3$ and not more than $6.25 \times 10^{17}$ atoms/cm$^3$.

According to one embodiment, the incorporation of nitrogen in a section of the single crystal having a uniform diameter is controlled such that the nitrogen concentration is not less than $0.7 \times 10^{13}$ atoms/cm$^3$ and not more than $2.5 \times 10^{13}$ atoms/cm$^3$.

The presence of hydrogen suppresses the formation of seeds of OSF defects and contributes to a uniform radial progression of the density of BMDs, in particular in the edge region of the semiconductor wafer. For this reason the single crystal of silicon from which the semiconductor wafer is separated is pulled in an atmosphere which comprises hydrogen, wherein the partial pressure of the hydrogen is preferably not less than 5 Pa and not more than 15 Pa.

To determine the hydrogen concentration, a test sample in the form of a cuboid block (3 cm×3 cm×30 cm) is cut from a single crystal. The test sample is treated at a temperature of 700° C. over a period of 5 minutes and thereafter rapidly cooled. Then the hydrogen concentration is measured by FTIR spectroscopy at room temperature. Before the FTIR measurement a portion of the hydrogen that would otherwise be withdrawn from the measurement is activated by irradiating the test sample with gamma rays from a $Co^{60}$ source. The energy dose of the radiation is 5000 to 21,000 kGy. A measurement campaign comprises 1000 scans at a resolution of 1 cm$^{-1}$ per test sample. Vibrational bands at wavenumbers of 1832, 1916, 1922, 1935, 1951, 1981, 2054, 2100, 2120 and 2143 cm$^{-1}$ are evaluated. The concentration of hydrogen is calculated from the sum of the integrated adsorption coefficients of the respective vibrational bands multiplied by the conversion factor $4.413 \times 10^{16}$ cm$^{-1}$. When the hydrogen concentration of a semiconductor wafer is to be measured the heat treatment of the test sample at a temperature of 700° C. is eschewed and a strip cut from the semiconductor wafer and having an area of 3 cm×20 cm is used as the test sample.

During pulling of the single crystal the ratio V/G must remain within narrow limits within which the single crystal crystallizes with an appropriate excess of vacancies in the $P_v$ region. This is done by controlling the pulling velocity V to control the ratio V/G. In order that the single crystal grows with an appropriate excess of vacancies in the $P_v$ region the pulling velocity V is controlled with the proviso that the velocity may not take every value in a span $\Delta V$ of pulling velocities that ensure growth of the single crystal in the $P_v$ region. The allowed pulling velocity is in a sub range of the span $\Delta V$ which comprises 39% of $\Delta V$ and whose lowest pulling velocity is 26% greater than the pulling velocity $V_{Pv/Pi}$ at the transition from the $P_v$ region to the $P_i$ region.

The pulling velocity $V_{Pv/Pi}$ and the span $\Delta V$ are experimentally determined, for example by pulling a test single crystal with linearly increasing or falling progress of the pulling velocity. The same hot zone as is intended for pulling a single crystal according to the invention is used. Every axial position in the test single crystal has a pulling velocity assigned to it. The test single crystal is cut axially and is examined for point defects for example by decoration with copper or by measuring the lifetime of minority charge carriers. The span $\Delta V$ extends from the lowest pulling velocity up to the highest pulling velocity at which $P_v$ region can be detected from the center to the edge of the test single crystal over a radial length of not less than 98% of the radius of the test single crystal. The lowest pulling velocity in this context is the pulling velocity $V_{Pv/Pi}$.

The pulling velocity V is preferably controlled in the recited fashion in the entire section of the single crystal having a uniform diameter so that all semiconductor wafers cut from this section have the intended properties. The diameter of the single crystal in this section and the diameter of the resulting semiconductor wafers is preferably not less than 200 mm, more preferably not less than 300 mm.

It is further advantageous to cool the single crystal to impede the formation of defects, for example the formation of seeds of OSF defects. The cooling rates are preferably not lower than:

1.7° C./min in the temperature range from 1250° C. to 1000° C.;
1.2° C./min in the temperature range from below 1000° C. to 800° C.; and 0.4° C./min in the temperature range from below 800° C. to 500° C.

The semiconductor wafer according to the invention is separated from a single crystal that has been pulled in an atmosphere comprising hydrogen from a melt doped with nitrogen (N+H codoping). The single-crystal is grown in the $P_v$ region as described above. The pulling of the single-crystal basically corresponds to the process described in WO 2017/097675 A1, which hereby is incorporated by reference.

The upper lateral surface and the lower lateral surface and also the edge of the semiconductor wafer are subsequently subjected to one or more mechanical processing steps and at least one polishing step.

On the polished upper lateral surface of the semiconductor wafer an epitaxial layer is deposited in a manner known per se.

The epitaxial layer is preferably composed of single-crystal silicon and preferably has a thickness of 2 μm to 7 μm.

The temperature during the deposition of the epitaxial layer is preferably 1100° C. to 1150° C.

After epitaxial deposition the semiconductor wafer does not contain any measurable concentration of hydrogen due to out-diffusion.

The semiconductor wafer and the epitaxial layer are doped with an electrically active dopant, for example boron, preferably analogously to the doping of a pp-doped epitaxial semiconductor wafer.

In a further embodiment the wafer is a nn-doped epitaxial wafer.

The BMDs in the semiconductor wafer are formed by subjecting the semiconductor wafer to heat treatments after the deposition of the epitaxial layer and before the production of electronic components.

According to the invention, the process comprises heat treating the epitaxial wafer at a temperature of 1015-1035° C. for 1 to 1.75 hours.

This is a clear advantage over the invention described in US2001/021574 A1 as the required annealing time is considerably lower. Thus, there is an advantage with regard to manufacturing cost. For a temperature of 1015° C. the annealing time needed according to US2001/021574 A1 would be 2.54 hours. For a temperature of 1035° C. the annealing time proposed by US2001/021574 A1 would be 2.04 hours.

The reason for the sufficiency of lower annealing times according to the invention is the use of a crystal grown in a defined process window of the $P_v$ region using N+H codoping.

According to one embodiment the process comprises heat treating the epitaxial wafer 25 in a first step at a temperature of 770-790° C. for 20 to 200 minutes and in a second and final step at a temperature of 1015-1035° C. for 1 to 1.75 hours. Between first and second step the temperature is increased to a predetermined temperature at a rate of 8° C. per minute.

The inventors developed a substrate for pp- or nn-doped epitaxial wafers having BMDs with a TIS of up to $7.0 \times 10^{12}$ at densities of $3 \times 10^8$ cm$^{-3}$ to $4 \times 10^9$ cm$^{-3}$ and sizes of 13-35 nm.

By thermal treatment steps after epitaxial deposition small-sized (<40 nm) radial homogeneous BMDs of octahedral shape are formed in the substrate.

Octahedral shaped BMDs will lead to reduced thermal stress after applied thermal steps at the customer.

The stable octahedral BMD shape ensures a very low local stress Si matrix, thus allowing stability of sub 16 nm design rule device structures (like FinFETs).

The inventive epitaxial wafer is suitable for future customer low thermal budget device cycles. There is no excess built up stress, thus slip and crack events at device structures at the <=10 nm design rule regime are avoided.

Without the heat treatment steps after epitaxial deposition these low thermal budget processes would be too small to generate sufficient BMD total inner surfaces (TIS) for a nickel getter efficiency of at least 80%.

The features specified in relation to the above-specified embodiments of the process for producing a semiconductor wafer made of single-crystal silicon according to the invention can be correspondingly applied to the semiconductor wafer made of single-crystal silicon according to the invention. Furthermore, the above-specified advantages in relation to the embodiments of the semiconductor wafer made of single-crystal silicon according to the invention therefore also relate to the corresponding embodiments of the process for producing a semiconductor wafer made of single-crystal silicon according to the invention. These and other features of specified embodiments of the invention are described in the claims as well as in the specification. The individual features may be implemented either alone or in combination as embodiments of the invention, or may be implemented in other fields of application. Further, they may represent advantageous embodiments that are protectable in their own right, for which protection is claimed in the application as filed or for which protection will be claimed during pendency of this application and/or continuing applications.

Unless stated otherwise, all parameters mentioned above and in the following examples were determined at a pressure of the surrounding atmosphere, i.e. at about 1000 hPa, and at a relative humidity of 50%.

EXAMPLES 300 mm single-crystal silicon ingots were pulled at a subsection of the so called vacancy rich "Pv" region at a pulling speed higher than 0.45 mm/min using a horizontal magnetic field. Nitrogen was added to the melt and the crystal was pulled in an atmosphere comprising hydrogen. Correct design of the hot zone ensures that the radial V/G is small enough to obtain a silicon wafer free of agglomerated vacancy defects.

The ingot nitrogen concentration measured by RT-FTIR was from $8 \times 10^{12}$ cm$^{-3}$ to $3.5 \times 10^{13}$ cm$^{-3}$. The concentration of interstitial oxygen measured by RT-FTIR was from $5.15 \times 10^{17}$ cm$^{-3}$ to $5.75 \times 10^{17}$ cm$^{-3}$.

The ingot was cut into segments, singled into 300 mm silicon wafers, ground, cleaned, double side and mirror polished.

Test wafers from different ingot positions (20, 25, 50, 55, 85 and 90%/seed, middle, tail) were used for epitaxial deposition and heat treatment. On each of the test wafers an epitaxial deposition step with typical epitaxial layer thickness of from 2 µm to 8 µm was applied and the resulting wafer was final cleaned.

Each of the wafers was then annealed in a furnace in a 95% $N_2$/5% $O_2$ ambient. Different furnace cycles (one step, two-step) were applied:

Example 1

Start at 650° C. with +8° C./min ramp up to final temperature of 1035° C. at a holding time of 1.1 h and ramp down at 3-5° C./min.

Example 2

Start at 650° C. with +8° C./min ramp up to a temperature of 780° C., holding the temperature for 120 min, then +8° C./min ramp-up to a final temperature of 1015° C. at a holding time of 1.2 h and ramp down at 3-5° C./min.

FIGURES

FIG. 1 shows the TIS over the ingot position for Examples 1 and 2. The TIS is from about $5.0 \times 10^{11}$ nm$^2$/cm$^3$ up to $2.5 \times 10^{12}$ nm$^2$/cm$^3$. A TIS of $2.5 \times 10^{12}$ nm$^2$/cm$^3$ corresponds to a nickel getter efficiency of about 85%.

Figure 2:
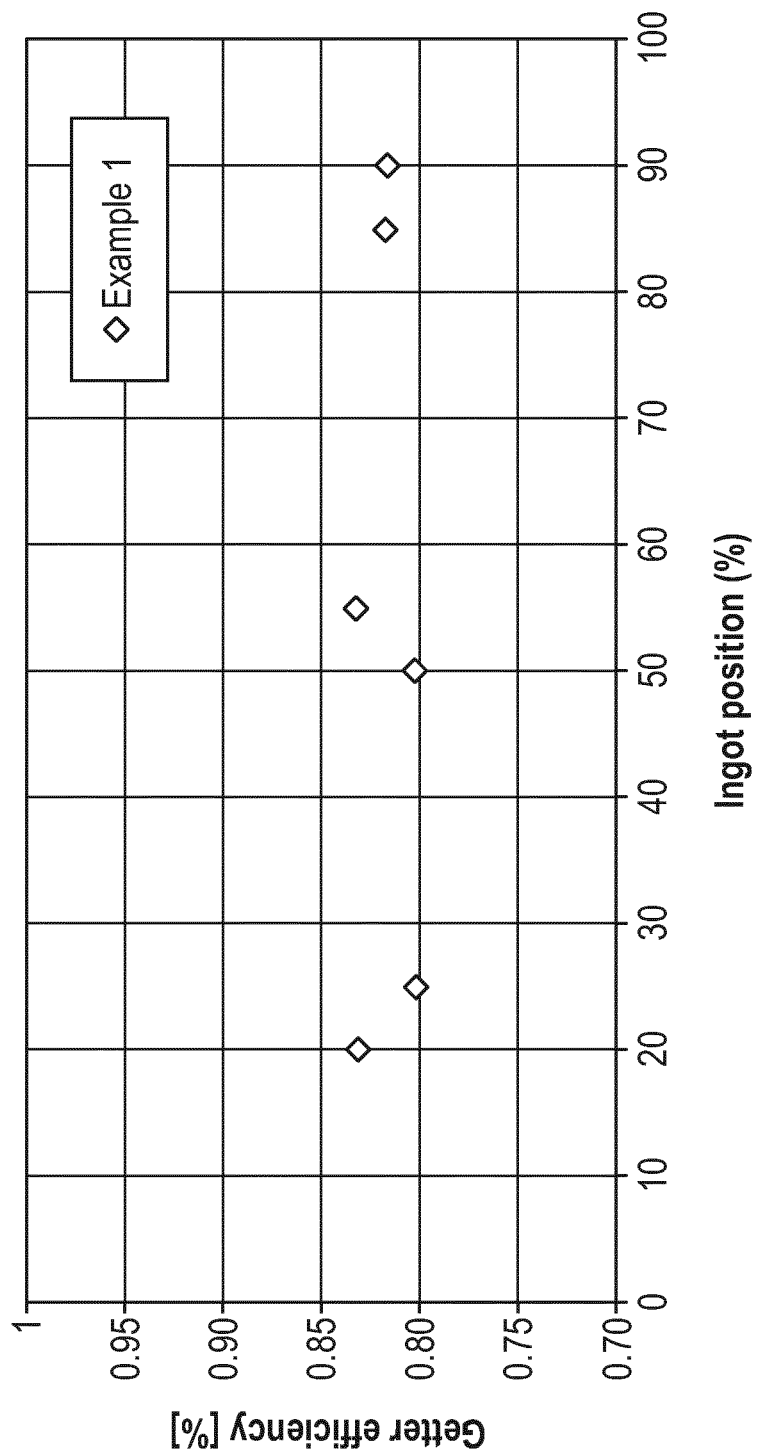
FIG. 2 shows the nickel getter efficiency over the ingot position for Example 1.

FIG. 2 shows the nickel getter efficiency over the ingot position for Example 1. For all samples at the different ingot positions the getter efficiency is at least 80%.

The getter test consists of a reproducible spin-on contamination of the wafers with nickel, followed by a metal drive-in at 900° C. for 30 min under argon with a cooling rate of 3° C./min at the end. Then the metal profile in the wafer is evaluated by etching step by step using a mixture of hydrofluoric and nitric acid and subsequent analysis of the respective etching solutions by ICPMS (inductively coupled plasma mass spectrometry).

Figure 3:
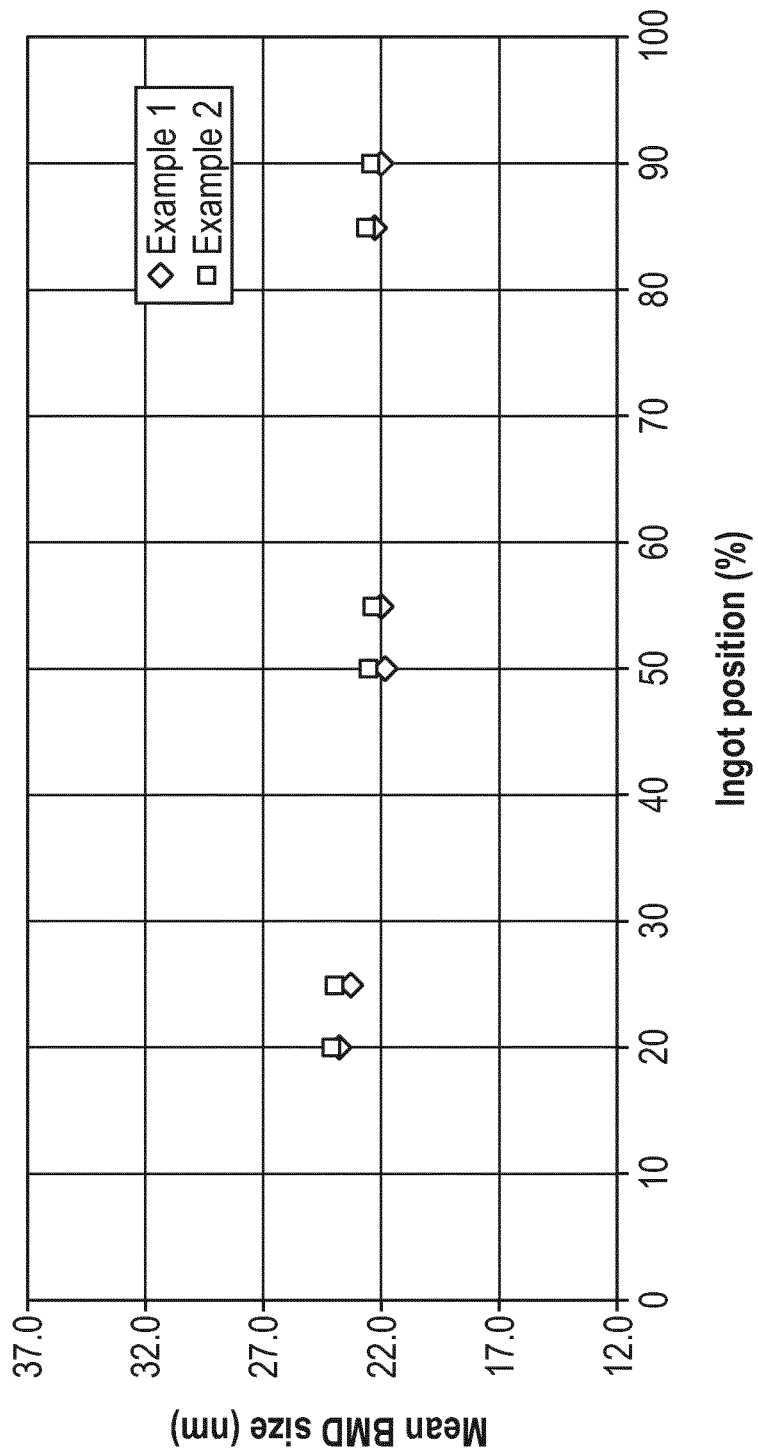
FIG. 3 shows the mean BMD size over the ingot position for Examples 1 and 2.

FIG. 3 shows the mean BMD size over the ingot position for Examples 1 and 2. The mean BMD sizes—determined by IR-LST—are from 22 to 24 nm.

Figure 4:
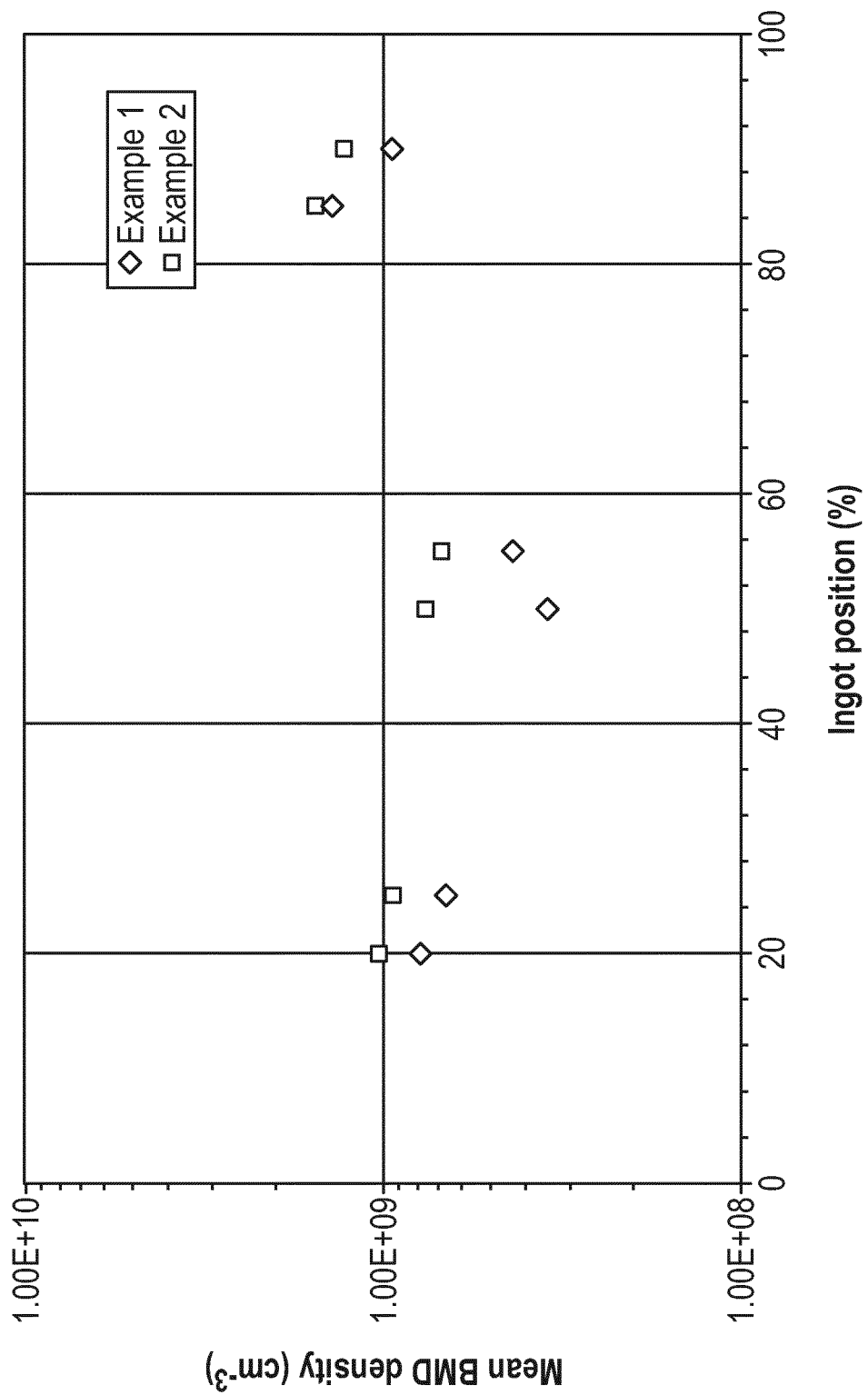
FIG. 4 shows the mean BMD density over the ingot position for Examples 1 and 2.

FIG. 4 shows the mean BMD density over the ingot position for Examples 1 and 2. The mean BMD densities—determined by IR-LST—are from $3.51 \times 10^8$ to $1.55 \times 10^9$ cm$^{-3}$.

The L×D$^{0.6}$ values for Examples 1 and 2 are from $1.56 \times 10^6$ to $6.86 \times 10^6$, i.e. far below the $1.0 \times 10^7$ lower limit mentioned in US2001/021574 A1.

Example 3

One-step furnace cycles were applied to the test wafers (from ingot positions tail, medium and seed) after epitaxial deposition: Start at 650° C. with +8° C./min ramp up to final temperature of 1020° C. at a holding time of 1.7 h and ramp down at 3-5° C./min.

Then BMD sizes and densities were determined and a getter test was performed as described above. The results are shown in Table 1.

TABLE 1

| Mean BMD size | Mean BMD density | Ingot Position | Getter efficiency |
|---|---|---|---|
| 23.7 nm | $2.8 \times 10^9$ cm$^{-3}$ | tail | 98.57% |
| 23.6 nm | $1.33 \times 10^9$ cm$^{-3}$ | medium | 97.46% |
| 25.9 nm | $1.28 \times 10^9$ cm$^{-3}$ | seed | 98.83% |

Example 3 shows excellent getter efficiencies for nickel. Thus, this thermal cycle is the most preferred one.

The above description of preferred embodiments has been given by way of example only. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A semiconductor wafer comprising single-crystal silicon with an oxygen concentration of not less than $4.9 \times 10^{17}$ atoms/cm$^3$ and not more than $6.5 \times 10^{17}$ atoms/cm$^3$ as measured by FTIR according to SEMI MF1188, and a nitrogen concentration of not less than $8 \times 10^{12}$ atoms/cm$^3$ and not more than $5 \times 10^{13}$ atoms/cm$^3$ as measured by FTIR against a known standard, wherein a frontside of the semiconductor wafer is covered with an epitaxial layer comprising silicon, and wherein the semiconductor wafer comprises BMDs of octahedral shape whose mean size is from 13 to 35 nm and whose mean density is not less than $3 \times 10^8$ cm$^{-3}$ and not more than $4 \times 10^9$ cm$^{-3}$ as determined by IR tomography, wherein the octahedral BMD shape is stable after a thermal treatment at 1000° C. for 5 hours to a depth of at least 100 µm.

2. The wafer of claim 1, wherein the wafer has a nickel getter efficiency of at least 80%.

3. The wafer of claim 1, wherein the TIS (total inner surface) of BMDs, defined as TIS=$4*\pi*r^2*D$, where r=mean radius of BMD and D is the mean BMD density, is from $4.0 \times 10^{11}$ nm$^2$/cm$^3$ to $7.0 \times 10^{12}$ nm$^2$/cm$^3$.

4. The wafer of claim 1, wherein the nitrogen concentration is not less than $9 \times 10^{12}$ atoms/cm$^3$ and not more than $3.5 \times 10^{13}$ atoms/cm$^3$.

5. The wafer of claim 1, wherein the oxygen concentration is not less than $5.15 \times 10^{17}$ atoms/cm$^3$ and not more than $5.75 \times 10^{17}$ atoms/cm$^3$.

6. The wafer of claim 1, wherein the BMDs of octahedral shape have a mean size of 20 to 27 nm.

7. The wafer of claim 1, wherein the mean density of octahedral BMDs is not less than $1.0 \times 10^9$ cm$^{-3}$ and not more than $3.0 \times 10^9$ cm$^{-3}$, as determined by IR tomography.

8. A process for producing a semiconductor wafer of claim 1 made of single-crystal silicon, comprising pulling a single crystal from a melt according to the CZ method in an atmosphere comprising hydrogen, wherein nitrogen has been added to the melt, so that in a section of the single crystal having a uniform diameter the oxygen concentration is not less than $4.9 \times 10^{17}$ atoms/cm$^3$ and not more than $6.5 \times 10^{17}$ atoms/cm$^3$, the nitrogen concentration is not less than $8 \times 10^{12}$ atoms/cm$^3$ and not more than $5 \times 10^{13}$ atoms/cm$^3$; and the hydrogen concentration is not less than $3 \times 10^{13}$ atoms/cm$^3$ and not more than $8 \times 10^{13}$ atoms/cm$^3$;

controlling a pulling velocity V such that it is within a span ΔV within which the single crystal in the section having a uniform diameter grows in a Pv region, wherein the pulling velocity V is in a subrange of the span which comprises 39% of the span and a lowest pulling velocity of the span is 26% greater than a pulling velocity at the transition from the Pv region to a Pi region;

and separating the semiconductor wafer from the section of the single crystal having a uniform diameter;

depositing an epitaxial layer of silicon on a frontside of the separated semiconductor wafer to form an epitaxial wafer;

heat treating the epitaxial wafer at a temperature of 1015-1035° C. for 1 to 1.75 hours in an ambient comprising Ar, $N_2$, $O_2$ or mixtures thereof.

9. The process of claim 8, wherein the epitaxial wafer is heat treated at a temperature of 770-790° C. for 20 to 200 minutes in a first step and at a temperature of 1015-1035° C. for 1 to 1.75 hours in a second and final step.

10. A semiconductor wafer sawn from a single crystal silicon ingot grown in a $P_v$ region in the present of hydrogen, comprising single-crystal silicon with an oxygen concentration of not less than $4.9 \times 10^{17}$ atoms/cm$^3$ and not more than $6.5 \times 10^{17}$ atoms/cm$^3$ as measured by FTIR according to SEMI MF1188, and a nitrogen concentration of not less than $8 \times 10^{12}$ atoms/cm$^3$ and not more than $5 \times 10^{13}$ atoms/cm$^3$ as measured by FTIR against a known standard, wherein a frontside of the semiconductor wafer is covered with an epitaxial layer comprising silicon, and wherein the semiconductor wafer comprises BMDs of octahedral shape whose mean size is from 13 to 35 nm and whose mean density is not less than $3 \times 10^8$ cm$^{-3}$ and not more than $4 \times 10^9$ cm$^{-3}$ as determined by IR tomography, wherein the octahedral BMD shape is stable after a thermal treatment at 1000° C. for 5 hours to a depth of at least 100 µm.

11. The semiconductor wafer of claim 10 which has been treated following deposition of the epitaxial layer comprising silicon, by thermally treating at a temperature of 1015 to 1035° C. for 1 to 1.75 hours in an ambient comprising Ar, $N_2$, $O_2$, or a mixture thereof, to form the octahedral BMDs.

* * * * *